US012137306B2

(12) United States Patent
St. Hilaire et al.

(10) Patent No.: US 12,137,306 B2
(45) Date of Patent: *Nov. 5, 2024

(54) VARIABLE-PITCH COLOR EMITTING DISPLAY

(71) Applicant: Magic Leap, Inc., Plantation, FL (US)

(72) Inventors: Pierre St. Hilaire, Belmont, CA (US); Evgeni Poliakov, San Mateo, CA (US); Sundeep Kumar Jolly, San Francisco, CA (US)

(73) Assignee: Magic Leap, Inc., Plantation, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/452,499

(22) Filed: Aug. 18, 2023

(65) Prior Publication Data
US 2023/0403378 A1    Dec. 14, 2023

Related U.S. Application Data

(63) Continuation of application No. 17/830,243, filed on Jun. 1, 2022, now Pat. No. 11,778,148, which is a
(Continued)

(51) Int. Cl.
*H04N 9/31*     (2006.01)
*G02B 27/10*    (2006.01)
(Continued)

(52) U.S. Cl.
CPC ....... *H04N 9/3158* (2013.01); *G02B 27/1006* (2013.01); *G02B 27/102* (2013.01);
(Continued)

(58) Field of Classification Search
CPC .. H04N 9/3141; H04N 9/3152; H04N 9/3155; H04N 9/3158; H04N 9/3161;
(Continued)

(56) References Cited

U.S. PATENT DOCUMENTS 4,852,988 A    8/1989   Velez
5,538,450 A    7/1996   Vickers
(Continued)

FOREIGN PATENT DOCUMENTS

CA    2316473 A1    1/2001
CA    2362895 A1    12/2002
CA    2388766 A1    12/2003

OTHER PUBLICATIONS

Abdou Youssef. (1999). "Image Downsampling and Upsampling Methods", National Institute of Standards and Technology, located at: https://scholar.google.com/scholar?q=Abdou+Youssef+Image+Downsampling+and+Upsampling+Methods&hl=en&as_sdt=0&as_vis=1&oi=scholart.
(Continued)

*Primary Examiner* — Sultan Chowdhury
(74) *Attorney, Agent, or Firm* — Morrison & Foerster LLP

(57) ABSTRACT

This disclosure relates to the use of variable-pitch light-emitting devices for display applications, including for displays in augmented reality, virtual reality, and mixed reality environments. In particular, it relates to small (e.g., micron-size) light emitting devices (e.g., micro-LEDs) of variable pitch to provide the advantages, e.g., of compactness, manufacturability, color rendition, as well as computational and power savings. Systems and methods for emitting multiple lights by multiple panels where a pitch of one panel is different than pitch(es) of other panels are disclosed. Each panel may comprise a respective array of light emitters. The multiple lights may be combined by a combiner.

20 Claims, 7 Drawing Sheets

Related U.S. Application Data continuation of application No. 17/112,961, filed on Dec. 4, 2020, now Pat. No. 11,381,791.

(60) Provisional application No. 62/943,568, filed on Dec. 4, 2019.

(51) Int. Cl.
  *H01L 25/075* (2006.01)
  *G02B 27/01* (2006.01)

(52) U.S. Cl.
  CPC ....... *H01L 25/0753* (2013.01); *H04N 9/3152* (2013.01); *H04N 9/3182* (2013.01); *G02B 2027/0112* (2013.01)

(58) Field of Classification Search
  CPC ............... H04N 9/3164; H04N 9/3182; G02B 27/0172; G02B 27/102; G02B 27/283; G02B 27/1006
  See application file for complete search history.

(56) References Cited

U.S. PATENT DOCUMENTS

| | | | |
|---|---|---|---|
| 5,614,961 | A | 3/1997 | Gibeau et al. |
| 6,433,760 | B1 | 8/2002 | Vaissie |
| 6,491,391 | B1 | 12/2002 | Blum et al. |
| 6,847,336 | B1 | 1/2005 | Lemelson |
| 6,863,400 | B1* | 3/2005 | Liang ................ G02B 27/1066 348/E5.053 |
| 6,943,754 | B2 | 9/2005 | Aughey |
| 6,977,776 | B2 | 12/2005 | Volkenandt et al. |
| 7,347,551 | B2 | 3/2008 | Fergason et al. |
| 7,488,294 | B2 | 2/2009 | Torch |
| 8,235,529 | B1 | 8/2012 | Raffle |
| 8,611,015 | B2 | 12/2013 | Wheeler |
| 8,638,498 | B2 | 1/2014 | Bohn et al. |
| 8,696,113 | B2 | 4/2014 | Lewis |
| 8,929,589 | B2 | 1/2015 | Publicover et al. |
| 9,010,929 | B2 | 4/2015 | Lewis |
| 9,274,338 | B2 | 3/2016 | Robbins et al. |
| 9,292,973 | B2 | 3/2016 | Bar-zeev et al. |
| 9,323,325 | B2 | 4/2016 | Perez et al. |
| 9,720,505 | B2 | 8/2017 | Gribetz et al. |
| 10,013,053 | B2 | 7/2018 | Cederlund et al. |
| 10,025,379 | B2 | 7/2018 | Drake et al. |
| 11,381,791 | B2 | 7/2022 | St. Hilaire et al. |
| 11,778,148 | B2 | 10/2023 | St. Hilaire et al. |
| 2003/0030597 | A1 | 2/2003 | Geist |
| 2006/0023158 | A1 | 2/2006 | Howell et al. |
| 2006/0044518 | A1 | 3/2006 | Allen et al. |
| 2006/0250580 | A1* | 11/2006 | Silverstein ............. H04N 9/315 348/E9.027 |
| 2008/0018861 | A1 | 1/2008 | Schuck et al. |
| 2008/0055721 | A1 | 3/2008 | Perkins et al. |
| 2008/0055722 | A1 | 3/2008 | Perkins et al. |
| 2008/0100804 | A1* | 5/2008 | Kanayama ........... H04N 9/3167 362/19 |
| 2009/0154155 | A1 | 6/2009 | Grötsch |
| 2010/0238364 | A1 | 9/2010 | Hall, Jr. |
| 2011/0211056 | A1 | 9/2011 | Publicover et al. |
| 2011/0213664 | A1 | 9/2011 | Osterhout |
| 2012/0021806 | A1 | 1/2012 | Maltz |
| 2013/0077147 | A1 | 3/2013 | Efimov |
| 2013/0301011 | A1 | 11/2013 | Cook et al. |
| 2014/0195918 | A1 | 7/2014 | Friedlander |
| 2015/0168731 | A1 | 6/2015 | Robbins |
| 2016/0198135 | A1 | 7/2016 | Kita et al. |
| 2018/0132330 | A1 | 5/2018 | Chong et al. |
| 2019/0229149 | A1 | 7/2019 | Yoo |
| 2019/0387168 | A1 | 12/2019 | Smith et al. |
| 2020/0258867 | A1 | 8/2020 | Harrold et al. |
| 2020/0310145 | A1 | 10/2020 | Eash et al. |
| 2020/0411491 | A1 | 12/2020 | Ahmed et al. |
| 2021/0159373 | A1 | 5/2021 | Grundmann |
| 2022/0295022 | A1 | 9/2022 | St. Hilaire et al. |

OTHER PUBLICATIONS

Bimber, Oliver et al. (2005). "Spatial Augmented Reality: Merging Real and Virtual Worlds," A. K. Peters, Ltd., Wellesley, MA.

Chinese Office Action dated Apr. 21, 2023, for CN Application No. 202080084171.0, with English translation, 9 pages.

European Search Report dated Dec. 21, 2022, for EP Application No. 20896930.3, twelve pages.

Intel Corporation. (Mar. 31, 2023). "Intel® Integrated Performance Primitives Developer Reference", located at: https://www.intel.com/content/www/us/en/docs/ipp/developer-reference/2021-8/overview.html.

International Preliminary Report on Patentability and Written Opinion mailed Jun. 16, 2022, for PCT Application No. PCT/US2020/063499, filed Dec. 4, 2020, eight pages.

International Search Report and Written Opinion mailed Mar. 11, 2021, for PCT Application No. PCT/US2020/063499, filed Dec. 4, 2020, sixteen pages.

Jacob, R. "Eye Tracking in Advanced Interface Design", Virtual Environments and Advanced Interface Design, Oxford University Press, Inc. (Jun. 1995).

Non-Final Office Action mailed Dec. 13, 2021, for U.S. Appl. No. 17/112,961, filed Dec. 4, 2020, 19 pages.

Non-Final Office Action mailed Mar. 6, 2023, for U.S. Appl. No. 17/830,243, filed Jun. 1, 2022, 12 pages.

Notice of Allowance mailed Apr. 13, 2022, for U.S. Appl. No. 17/112,961, filed Dec. 4, 2020, 11 pages.

Notice of Allowance mailed Jul. 18, 2023, for U.S. Appl. No. 17/830,243, filed Jun. 1, 2022, 11 pages.

Rolland, J. et al., "High- resolution inset head-mounted display", Optical Society of America, vol. 37, No. 19, Applied Optics, (Jul. 1, 1998).

Tanriverdi, V. et al. (Apr. 2000). "Interacting With Eye Movements In Virtual Environments," Department of Electrical Engineering and Computer Science, Tufts University, Medford, MA 02155, USA, Proceedings of the SIGCHI conference on Human Factors in Computing Systems, eight pages.

Yoshida, A. et al., "Design and Applications of a High Resolution Insert Head Mounted Display", (Jun. 1994).

Chinese Office Action dated Oct. 12, 2023, for CN Application No. 202080084171.0, with English translation, 8 pages.

\* cited by examiner

VARIABLE-PITCH COLOR EMITTING DISPLAY

CROSS-REFERENCE TO RELATED APPLICATIONS

This application is a continuation of U.S. Non Provisional application Ser. No. 17/830,243, filed Jun. 1, 2022, which is a continuation of U.S. Non-Provisional application Ser. No. 17/112,961, filed Dec. 4, 2020, which claims the benefit of U.S. Provisional application Ser. No. 62/943,568, filed on Dec. 4, 2019, the entire disclosure of which is incorporated herein by reference for all purposes.

FIELD

This disclosure relates in general to systems and methods for variable-pitch color emitting displays, and in particular to systems and methods for displays in augmented reality, virtual reality, and mixed reality environments.

BACKGROUND

Some of the current augmented reality (AR) systems and mobile projection display systems utilize the reflective liquid-crystal on silicon (RLCOS) display, which is a relatively slow-switching device based on liquid-crystal technology, and employs the bulky polarization optics architecture, as exemplified in FIG. 1. Some of the common disadvantages of this well-established technology are low optical throughput due to the high losses associated with polarization optical elements and also low-speed switching times of 60-120 Hz.

The LCOS projection systems usually consists of a reflective LCOS display and polarization optics with a focusing element, e.g., in FIG. 1. Because of having a front polarizer, at least 55% of light may be lost immediately and further out-coupled light is lost through the focusing lens elements. The LC technology, although well-established, cannot change the black-to-color states rapidly and is typically limited by 120 Hz.

SUMMARY

Systems and methods for emitting multiple lights by multiple panels where a pitch of one panel is different than pitch(es) of other panels are disclosed. Each panel may comprise a respective array of light emitters. The multiple lights may be combined by a combiner.

In some embodiments, the multiple lights may comprise a red light, a green light, and a blue light. In some embodiments, each of the multiple lights may be a monochrome light. In some embodiments, light emitters of one array may be smaller in size than light emitters of other array(s).

In some embodiments, a light emitter of a first array may have a first single-emitter footprint with dimensions associated with a first pitch of a first panel, a light emitter of a second array may have a second single-emitter footprint with dimensions associated with a second pitch of the second panel, a light emitter of a third array may have a third single-emitter footprint with dimensions associated with a third pitch of a third panel, and the second single-emitter footprint may be smaller than the first single-emitter footprint and may be smaller than the third single-emitter footprint.

In some embodiments, a same set of dimensions may be occupied by each of: the first single-emitter footprint, the third single-emitted footprint, and a 2×2 array of four light emitters each having the second single-emitter footprint. In some embodiments, a same set of dimensions may be occupied by each of: the third single-emitted footprint, a 2×2 array of four light emitters each having the first single-emitter footprint, and a 4×4 array of sixteen light emitters each having the second single-emitter footprint.

In some embodiments, a first light may have a first color, a second light may have a second color, and a third light may have a third color, and systems may comprise electronic hardware for: receiving video data, performing color-wise down-sampling on the received video data at the first color for the first light, performing color-wise down-sampling on the received video data at the third color for the third light, and driving the first panel, the second panel, and the third panel, wherein the first panel is driven based on the color-wise down-sampled video data at the first color for the first light, and the third panel is driven based on the color-wise down-sampled video data at the third color for the third light.

In some embodiments, a first light may have a first color, a second light may have a second color, and a third light may have a third color, the systems may comprise first electronic hardware configured for: receiving first video data having a first resolution, and driving the first panel based on the first video data having the first resolution; second electronic hardware configured for: receiving second video data having a second resolution, and driving the second panel based on the second video data having the second resolution; and third electronic hardware configured for: receiving third video data having a third resolution, and driving the third panel based on the third video data having the third resolution, wherein a full-color video is based on the first video data, the second video data, and the third video data, and wherein the second resolution for the second panel is higher than the first resolution for the first panel and is higher than the third resolution for the third panel.

In some embodiments, the combiner may comprise an X-cube combiner.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Figure 1:
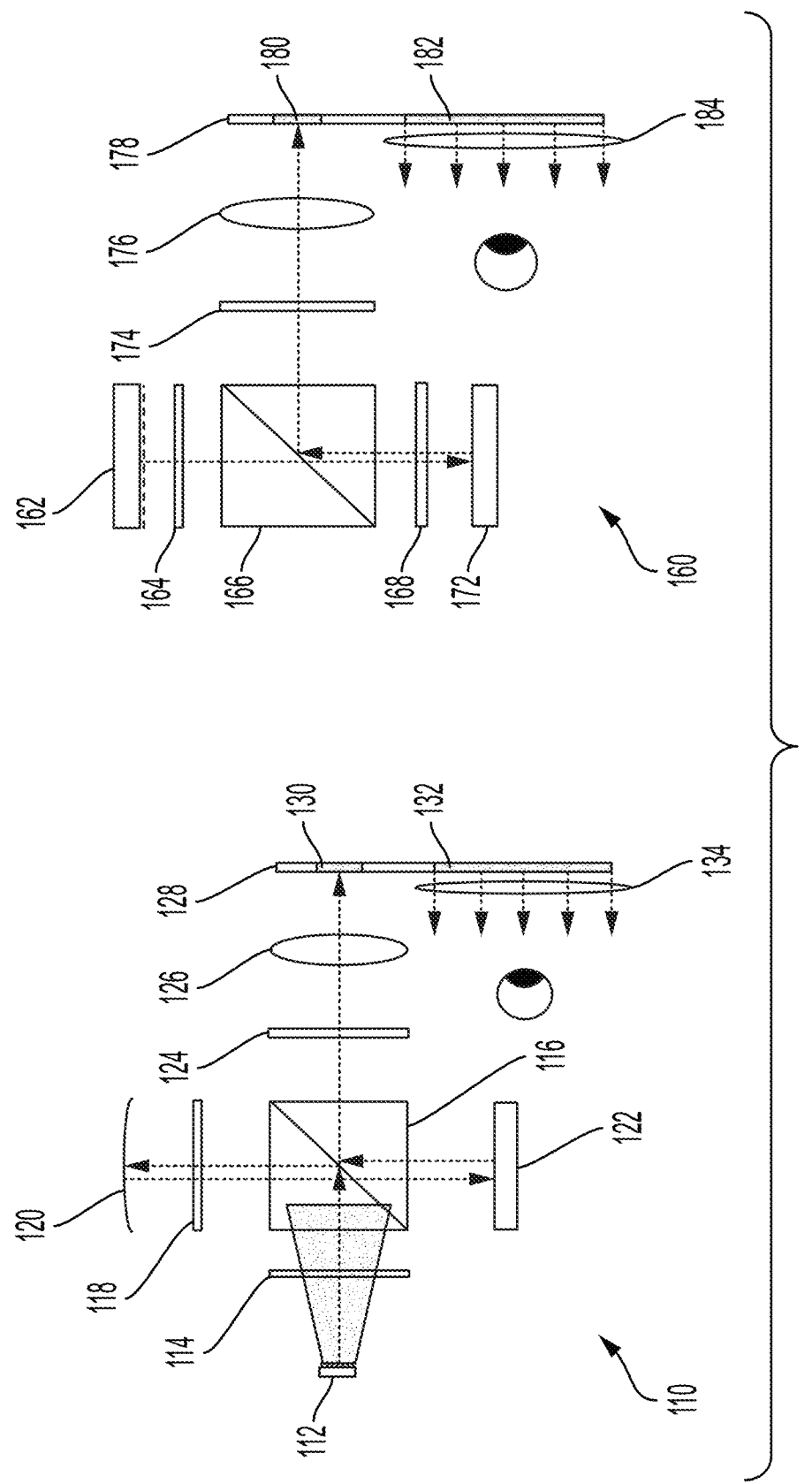
FIG. 1 illustrates full-color LCoS-based projector systems employing three-color illumination and modulation in a parallel fashion.

FIG. 1 illustrates full-color LCoS-based projector systems employing three-color illumination and modulation in a parallel fashion. On the left side of FIG. 1, projector system 110 comprises a red-green-blue (RGB) light source 112 (having micro-light-emitting diode (µLED) with micro-lens array (MLA)), pre-polarization filter 114, polarization beam-splitter (PBS) 116, quarter-wave plate (QWP) 118, collimator 120, reflective LCOS display 122, clean-up polarization filter 124, projection lens 126, eyepiece 128 (having input coupler grating (ICG) 130 and exit pupil expander (EPE) region 132), and variable focus element (VFE) 134. The RBG light source 112 provides three-color illumination and the reflective LCOS display 122 provides modulation in a parallel fashion.

On the right side of FIG. 1, projector system 160 comprises an RGB light source 162 (having µLED with MLA), pre-polarization filter 164, PBS 166, QWP 168, reflective LCOS display 172, clean-up polarization filter 174, projection lens 176, eyepiece 178 (having ICG 180 and EPE region 182), and VFE 184. The RBG light source 162 provides three-color illumination and the reflective LCOS display 172 provides modulation in a parallel fashion.

In FIG. 1, the left-side projector system 110 and the right-side projector system 160 differ in various aspects. For example, the left-side projector system 110 comprises collimator 120, but the right-side projector system 160 has no collimator. As another example, the left-side projector system 110 has an arrangement where QWP 118 is located in between PBS 116 and collimator 120, but the right-side projector system 150 has an arrangement where QWP 168 is located in between PBS 166 and reflective LCOS display 172. As yet another example, the left-side projector system 110 has an arrangement where there is no QWP is needed in between PBS 116 and reflective LCOS display 122, but the right-side projector system 150 has an arrangement where QWP 168 is located in between PBS 166 and reflective LCOS display 172.

Figure 2:
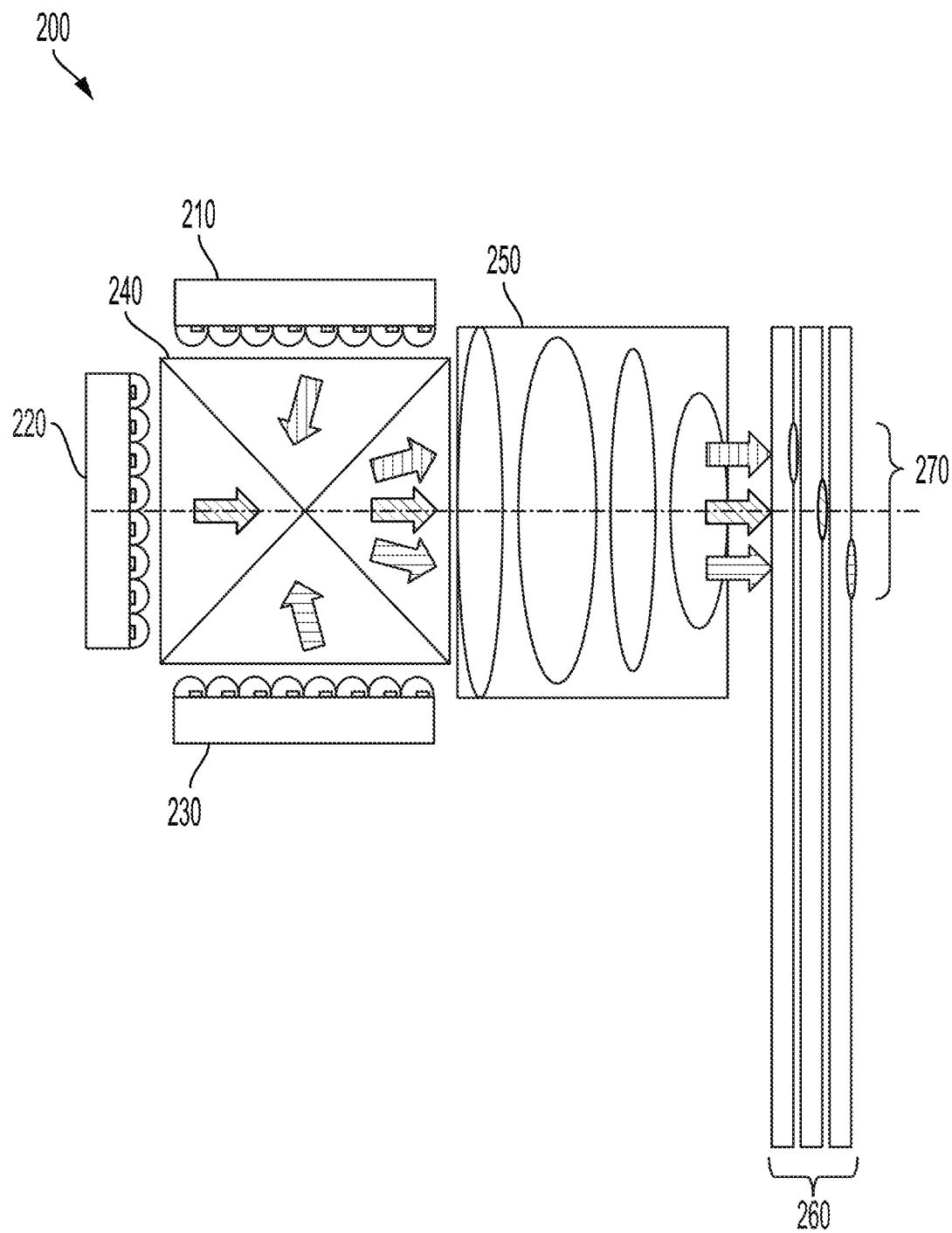
FIG. 2 illustrates a micro-LED same-pitch X-cube geometry for a projector system.

Embodiments described herein may use micro-LED (tiny emitting light-emitting diode (LED)) devices, which may allow creation of images directly on the color panel, thus simplifying the optics design, negating polarization optics, and making the use of RLCOS techniques unnecessary. In addition to the switching speeds of kHz rates, we propose here (e.g., instead of the commonly employed 3-panel micro-display architecture of X-cube combiner and projection optics as depicted in FIG. 2), a novel architecture in which each color panel may be represented by its own light-emitter pitch and its own resolution. The advantages of such display techniques (e.g., geometry) may include large power savings, simplified design, and reduced cost and complexity of the system.

FIG. 2 illustrates a micro-LED same-pitch X-cube geometry for a projector system. In FIG. 2, projector system 200 comprises a red micro-LED panel 210, a green micro-LED panel 220, a blue micro-LED panel 230, an X-cube combiner 240, projection optics 250, and RBG eyepiece 260 (having ICG 270). All three panels 210, 220, and 230 have the same pitch for their respective micro-LEDs.

Figure 3:
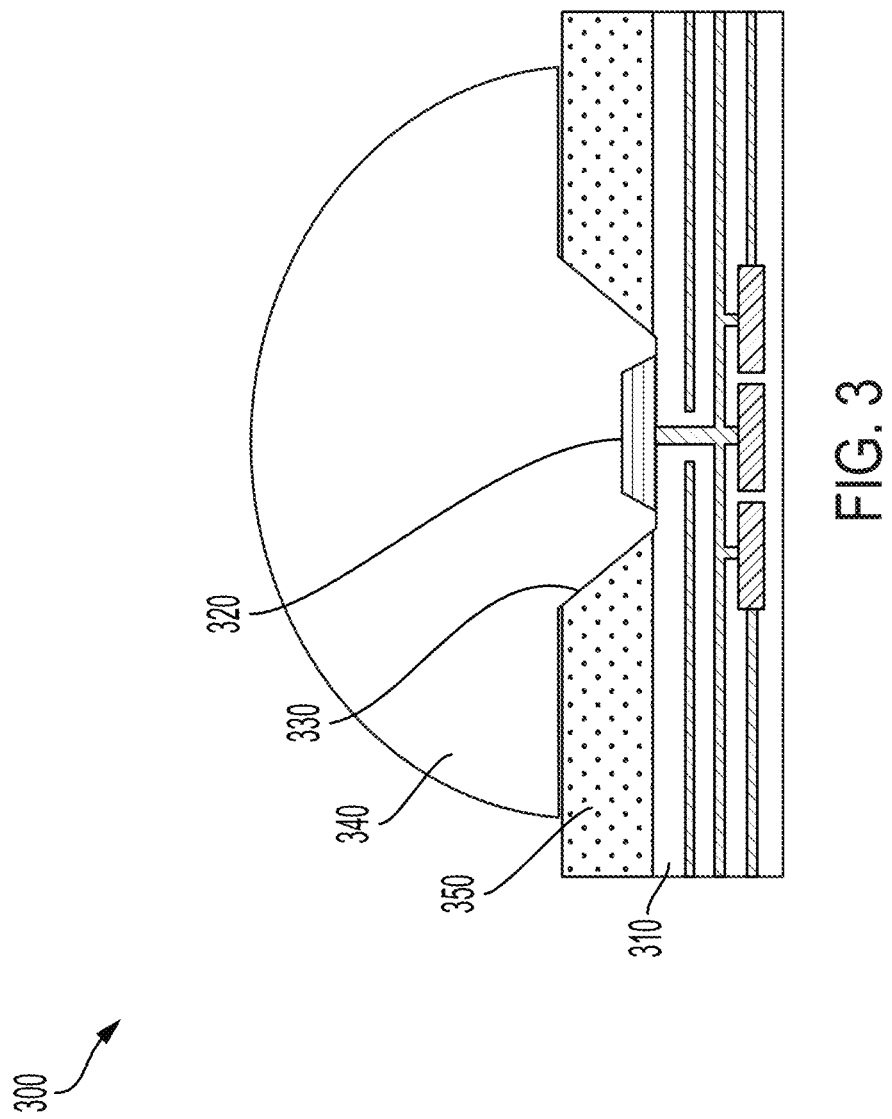
FIG. 3 illustrates an exemplary architecture of an individual μLED-emitter.

A common bottleneck of micro-LED emitting devices, such as those shown in the example of FIG. 3, can be their reduced efficiency with the size reduction of the individual emitters (e.g., the device pitch and emitter size). For example, 10 um pixel size devices are more efficient than 5 um pixel size devices. It can be advantageous (e.g., in terms of optical emittance) to use larger size emitters. However, that is not always possible when there is a need for high-resolution images and/or a desired field-of-view (FOV).

FIG. 3 illustrates an exemplary architecture of an individual µLED-emitter. In FIG. 3, individual µLED-emitter 300 comprises a complementary metal-oxide semiconductor (CMOS) backplane 310, a III-V compound semiconductor emitter 320, a reflection cup 330, a micro-lens 340, and optical insulation 350. The CMOS backplane 310 may use pulse-width modulation (PWM) control for the µLED-emitter 300. The III-V compound semiconductor emitter 320 may provide or promote high efficiency for the µLED-emitter 300. The reflection cup 330 may provide or promote high brightness for the µLED-emitter 300. The micro-lens 340 may provide or promote light collimation for the µLED-emitter 300. The optical insulation 350 may provide or promote display quality for the µLED-emitter 300.

Another problem can lie in utilizing the natural color emitters versus color-converted micro-LEDs, especially in the red part of the color spectrum. A typical approach uses a blue pump LED to pump the semiconductor stack to color-shift from blue to green and/or red wavelengths. The red emitter uses either a phosphor dye (e.g., for emitters>50 um size emitters), or relies on quantum-dot (QD) color conversion (e.g., below 50 um size emitters). While these schemes are routinely utilized, they provide low conversion efficacy rates (e.g., <30% for blue-red optical conversion), a non-collimated Lambertian output, and have limited reliability.

As disclosed herein, using larger size natural red and blue emitters can address these problems above. They can improve overall display efficacy (in blue and red panels of blue and red emitters, respectively) while still using smaller pixel size green micro-LEDs with very little apparent degradation of image quality. Embodiments of the disclosure described herein may rely on a simple interesting fact that the human vision system is best adapted to green light, and therefore the required high-end resolution for some augmented reality/virtual reality/mixed reality (AR/VR/MR) systems may be reached in green light, but may be not required in the red and blue parts of the wavelength spectrum. Thus, one can still use large size red emitters negating the effect of the low efficacy in the red wavelengths, which may be particularly important for not-yet-fully-developed native red micro-LEDs. Since the required portion of red (and blue) light can utilize the larger emitters, which can produce higher brightness than the solutions with equal-pitch color panels, the resulting solutions can offer more optical output/brightness.

Embodiments of the disclosure may employ a novel µLED-based three-color (e.g., R/G/B) projector based on optical combining of light emitted by three monochrome (e.g., R, G, or B) panels (e.g., via an X-cube color combiner). Unlike conventional color projectors based around similar optical combining schemes, the embodiments described herein may employ multiple (e.g., three) individual monochrome panels having micro-emitters with variable pitch per panel.

Some embodiments may employ a projector configuration (e.g., geometry) based around the use of a single (e.g., green) panel having an array of 1280×720 emitters with 2.5 µm pitch in conjunction with two (e.g., red and blue) panels each having an array of 640×360 emitters with 5 µm pitch. In such a configuration, the individual monochrome panels may each have the same overall dimensions. Due to the variably-pitched configuration, the footprint occupied by a single red pixel and a single blue pixel may be occupied by four green pixels (e.g., as shown in FIG. 4A) after beam-combining.

Figure 4A:
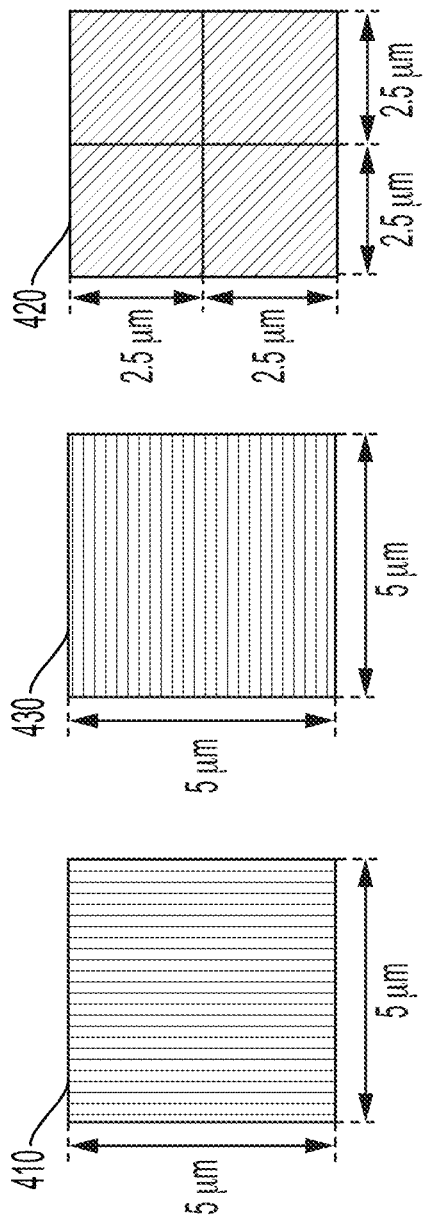
FIGS. 4A and 4B illustrates example emitter footprints in per-color variable resolution scheme, according to embodiments described herein.

FIG. 4A illustrates example emitter footprints in per-color variable resolution scheme, according to embodiments described herein. Red emitter footprint 410 may have dimensions of 5 µm×5 µm for a single red pixel. Blue emitter footprint 430 may also have dimensions of 5 µm×5 µm for a single blue pixel. Green emitter footprint 420 may have dimensions of 5 µm×5 µm for a 2×2 array of four green pixels, each having a smaller footprint having dimensions of 2.5 µm×2.5 µm for a single green pixel.

Another example configuration may employ a green panel having an array of 1280×720 emitters with 2.5 µm pitch, a red panel having an array of 640×360 emitters with 5 µm pitch, and a blue panel having an array of 320×180 emitters with 10 µm pitch. In this configuration, the footprint occupied by a single blue pixel may be occupied by four red pixels and sixteen green pixels (e.g., as shown in FIG. 4B).

Figure 4B:
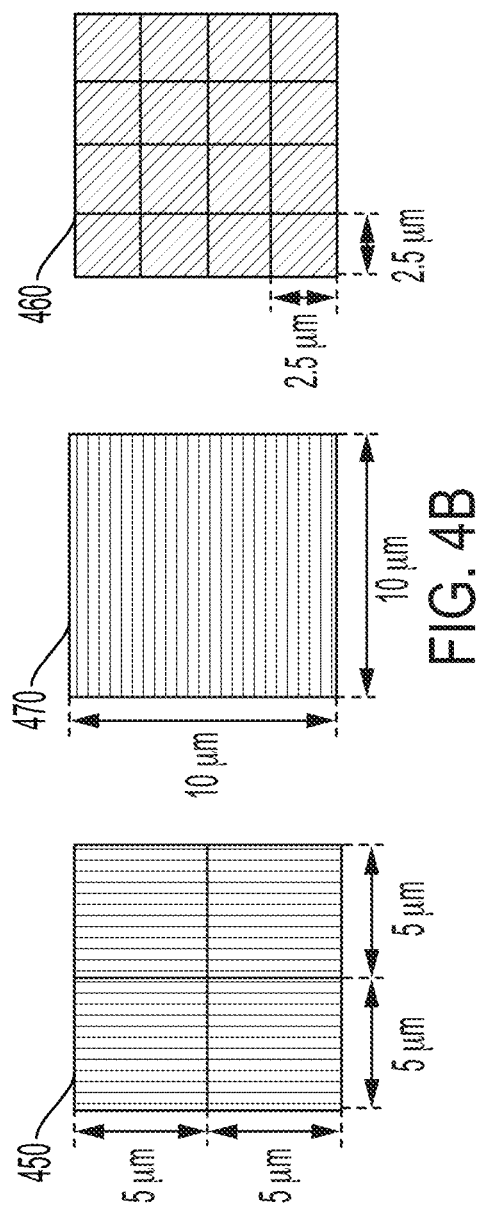

FIG. 4B illustrates example emitter footprints in per-color variable resolution scheme, according to embodiments described herein. Red emitter footprint 450 may have dimensions of 10 µm×10 µm for a 2×2 array of four red pixels, each having a smaller footprint having dimensions of 5 µm×5 µm for a single red pixel. Blue emitter footprint 430 may have dimensions of 10 µm×10 µm for a single blue pixel. Green emitter footprint 420 may have dimensions of 10 µm×10 µm for a 4×4 array of sixteen green pixels, each having a smaller footprint having dimensions of 2.5 µm×2.5 µm for a single green pixel.

Both of these above example architectures may take advantage of the aforementioned characteristics of the human visual system, in which acuity may be most prevalent for green wavelengths and least so for blue wavelengths.

Employing embodiments of the disclosure, full-color computer imagery may be presented at full resolution (e.g., 1280×720) in the green channel and at quarter-resolution (e.g., 640×360) for the red and blue channels, or even lower resolution for the blue channel. In an example hardware instantiation, one of two video data processing and transmission schemes can be used: 1) full-resolution, full-color imagery can be presented to combined electronic hardware responsible for driving all three µLED panels, at which point the color-wise down sampling for the lower-resolution color panels can occurs at the hardware level, or 2) imagery per color can be rendered at different resolutions (e.g., green at 1280×720, red at 640×360, blue at 640×360 or less) and transmitted to individual driving electronic hardware per panel in parallel data streams.

Embodiments can remove the need for the small-size emitters (e.g., 2.5 um or so) required for high-resolution optical systems of <2 arcmin for large fields of view (FOVs). For example, it is demonstrated that using Blue-panel and Red-panel color pixels that are twice the size of emitters for Green-panel is viable. This concept can remove a principal source of uncertainty for µLED displays, which was the red intensity for native (not color-converted) red sources. It can also help with the Blue-panel which apparently can also be difficult to scale down towards 2.5 um pixel size devices. Again, using the large size Blue and Red panels can give brighter displays, and can reduce power consumption (as smaller size emitters can become less efficient due to a higher current density and semiconductor edge effect), while use of a higher-pitch green panel can provide the appropriate level of image quality for human perception. Moreover, maintaining the same overall format can allow one to keep the same projection system as a common standard.

Figure 5:
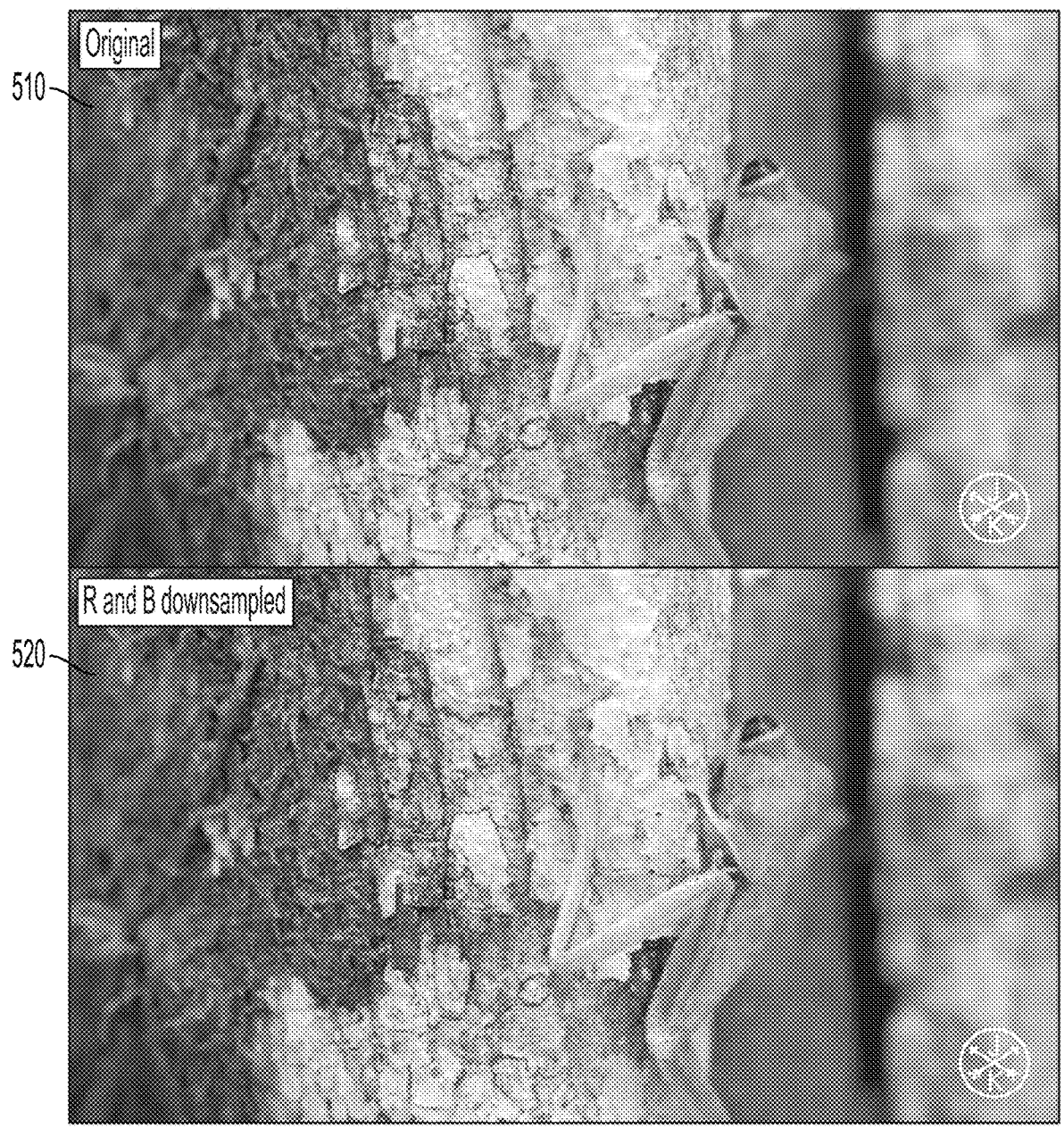
FIG. 5 illustrates a representation of a same-pitch micro-LED generated image (top) compared to a representation of a variable-pitch micro-LED generated image (bottom).

FIG. 5 illustrates a representation of a same-pitch micro-LED generated image (top) compared to a representation of a variable-pitch micro-LED generated image (bottom). The bottom image 520 represents an image generated using blue and red emitters that are twice as large compared to the green emitter. The image quality for both the top image 510 and the bottom image 520 can appear to the human visual system to be nearly identical.

Figure 6A:
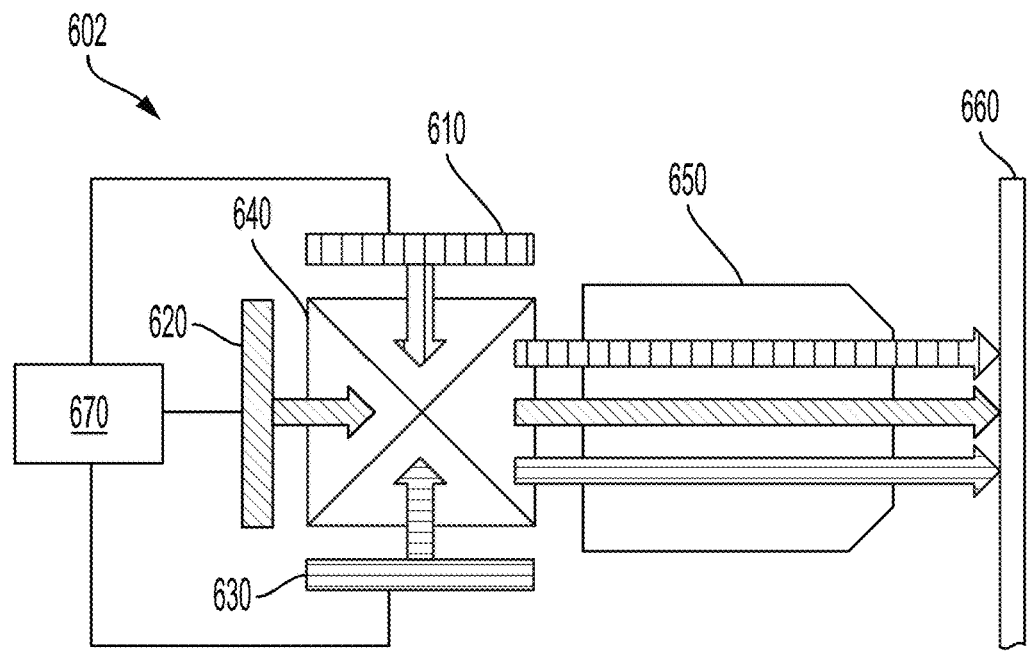
FIGS. 6A and 6B illustrate example systems each with multiple panels and varying pitches.
Figure 6B:
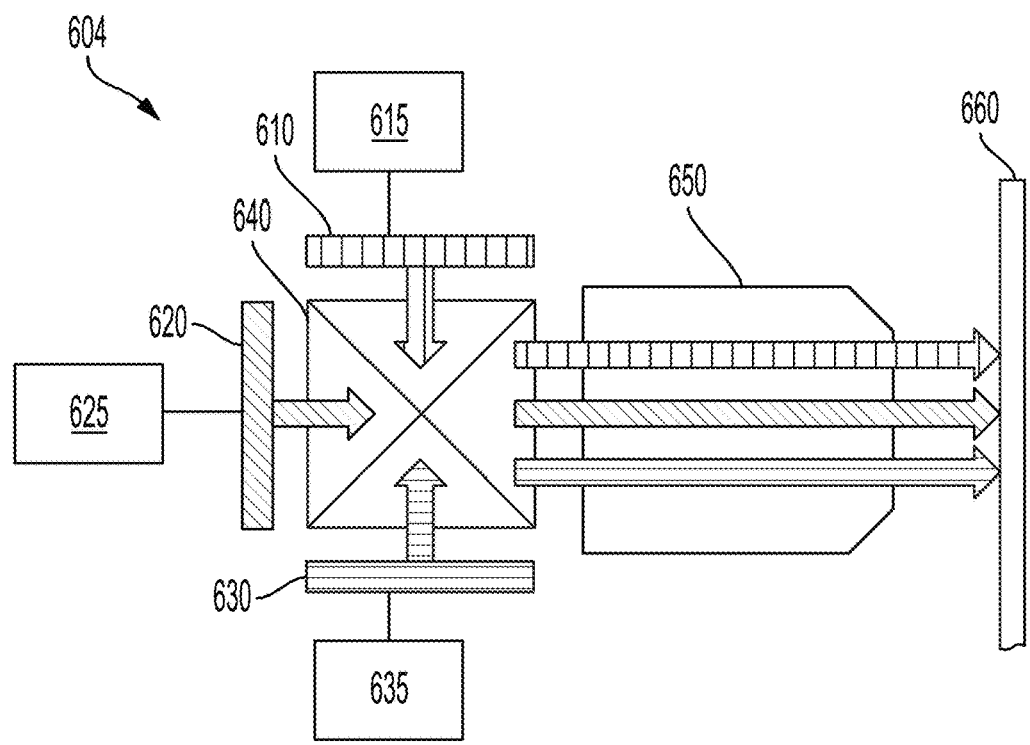

FIGS. 6A and 6B illustrate example systems each with multiple panels and varying pitches. In FIGS. 6A and 6B, system 602 and system 604 may each comprise a first panel 610, a second panel 620, a third panel 630, an X-cube combiner 640, and projection optics 650. One or more of the red panel 610, the green LED panel 620, and blue LED panel 630 may comprise a micro-LED panel. One or more of the red panel 610, the green LED panel 620, and blue LED panel 630 may comprise a monochrome light panel. The three panels 610, 620, and 630 may have a respective pitch for their respective light-emitting elements, and the three respective pitches may be non-uniform, as described in the examples and embodiments above. System 602 and system 604 may each be used with an eyepiece 660, such as for an AR or VR or MR system. In FIG. 6A, system 602 may be used with combined electronic hardware 670 (e.g., combined driving circuitry) for driving all three panels 610, 620, and 630, as described above for a first example hardware instantiation for a first video data processing and transmission scheme. In FIG. 6B, system 604 may be used with three separate individual pieces 615, 625, and 635 of electronic hardware (e.g., three separate driving circuits) for driving the three panels 610, 620, and 630, respectively, as described above for a second example hardware instantiation for a second video data processing and transmission scheme.

Systems 602 and 604 of FIGS. 6A and 6B may each create or generate images directly on one or more of first panel 610, second panel 620, and third panel 630. Compared with other display system designs, systems 602 and 604 may each have a simplified optics design. For example, polarization optics may be reduced or negated, so that each of systems 602 and 604 may exclude or lack any or all of the polarization components in FIG. 1. As another example, an LCOS display may be unnecessary, so that each of systems 602 and 604 may exclude or lack any or all LCOS displays in FIG. 1. Systems 602 and 604 may each operate at kHz switching speeds. Compared with other display system designs, systems 602 and 604 may each provide large power savings. Compared with other display system designs, systems 602 and 604 may each provide reduced cost or complexity.

Figure 7A:
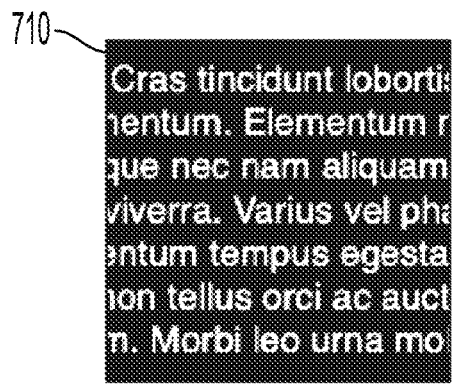
FIGS. 7A-7D illustrate text-based simulation of per-color variable-resolution down-sampling.
Figure 7B:
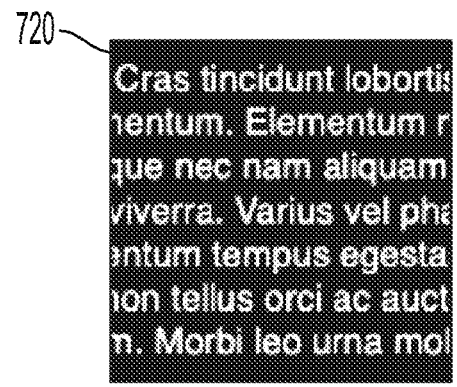
Figure 7C:
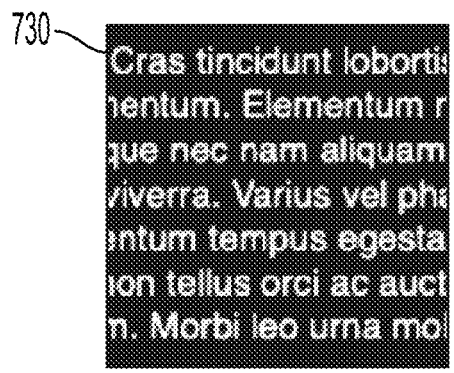
Figure 7D:
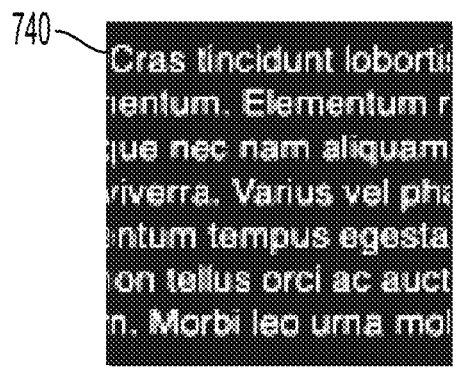

FIGS. 7A-7D illustrate text-based simulation of per-color variable-resolution down-sampling. FIG. 7A represents full-resolution rendering 710 for red, green, and blue color channels. FIG. 7B represents full-resolution rendering 720 for green and quarter-resolution down-sampling and rendering for red and blue. FIG. 7C represents full-resolution rendering 730 for green, quarter-resolution down-sampling for red, and sixteenth-resolution down-sampling for blue. FIG. 7D represents quarter-resolution rendering 740 for red, green, and blue color channels.

Among these four renderings, rendering 710 may appear to the human visual system to have the highest color contrast (e.g., letter coloring vs. background coloring) and the highest sharpness (e.g., edges of letters). Renderings 720 and 730 may appear to the human visual system to be nearly identical. Rendering 710 may appear to the human visual system to have solid white lettering. Relative to rendering 710, the lettering of renderings 720 and 730 may appear to have a faint green tinge. Rendering 730 may appear to the human visual system to have a similar white color for its lettering, but the sharpness may appear to be the lowest among all four renderings depicted by FIGS. 7A-7D.

Although the disclosed examples have been fully described with reference to the accompanying drawings, it is to be noted that various changes and modifications will become apparent to those skilled in the art. For example, elements of one or more implementations may be combined, deleted, modified, or supplemented to form further implementations. Such changes and modifications are to be understood as being included within the scope of the disclosed examples as defined by the appended claims.

What is claimed is:

1. A system comprising:
a first panel comprising a first array of light emitters, the first panel configured for emitting a first light at a first resolution, the first light comprising a first color;
a second panel comprising a second array of light emitters, the second panel configured for emitting a second light at a second resolution, the second light comprising a second color different than the first color;
a third panel comprising a third array of light emitters, the third panel configured for emitting a third light at a third resolution, the third light comprising a third color different than the first color and the second color; and
a combiner configured to combine the first light, the second light, and the third light; and
one or more processors configured to perform a method comprising:
receiving video data,
generating first down-sampled video data based on the received video data, the first down-sampled video data associated with the first color,
generating second down-sampled video data based on the received video data, the second down-sampled video data associated with the third color, and
driving the first panel, the second panel, and the third panel, wherein:
the first light emitted by the first panel is based on the first down-sampled video data, and
the third light emitted by the third panel is based on the second down-sampled video data.

2. The system of claim 1, wherein the second resolution of the second panel is higher than the first resolution of the first panel and is higher than the third resolution of the third panel.

3. The system of claim 1, wherein the first light comprises a red light, the second light comprises a green light, and the third light comprises a blue light.

4. The system of claim 1, wherein:
the first light comprises a first monochrome light,
the second light comprises a second monochrome light, and
the third light comprises a third monochrome light.

5. The system of claim 1, wherein the light emitters of the second array are smaller in size than the light emitters of the first array and are smaller in size than the light emitters of the third array.

6. The system of claim 1, wherein:
a light emitter of the first array has a first single-emitter footprint corresponding to a first set of dimensions;
a light emitter of the second array has a second single-emitter footprint corresponding to a second set of dimensions; and
a light emitter of the third array has a third single-emitter footprint corresponding to a third set of dimensions, and wherein the second single-emitter footprint is smaller than the first single-emitter footprint and is smaller than the third single-emitter footprint.

7. The system of claim 6, wherein a 2×2 array of four light emitters of the second array corresponds to a fourth set of dimensions, and wherein each of the first set of dimensions, the third set of dimensions, and the fourth set of dimensions are substantially equal.

8. The system of claim 7, wherein:
a 2×2 array of four light emitters of the first array corresponds to a fifth set of dimensions, a 4×4 array of sixteen light emitters of the second array corresponds to a sixth set of dimensions, and
each of the third set of dimensions, the fifth set of dimensions, and the sixth set of dimensions are substantially equal.

9. The system of claim 1, wherein:
the received video data comprises video data having a fourth resolution;
the first down-sampled video data comprises video data having a fifth resolution; and
the second down-sampled video data comprises video data having a sixth resolution, and
wherein the fourth resolution is four times the fifth resolution and is four times the sixth resolution.

10. The system of claim 1, wherein:
the received video data comprises video data having a fourth resolution;
the first down-sampled video data comprises video data having a fifth resolution; and
the second down-sampled video data comprises video data having a sixth resolution, and
wherein the fourth resolution is four times the fifth resolution and is sixteen times the sixth resolution.

11. The system of claim 1, wherein the combiner comprises an X-cube combiner.

12. A method comprising:
emitting, by a first panel comprising a first array of light emitters, a first light at a first resolution, the first light comprising a first color;
emitting, by a second panel comprising a second array of light emitters, a second light at a second resolution, the second light comprising a second color different than the first color;
emitting, by a third panel comprising a third array of light emitters, a third light at a third resolution, the third light comprising a third color different than the first color and the second color;
combining, by a combiner, the first light, the second light, and the third light;
receiving video data;
generating first down-sampled video data based on the received video data, the first down-sampled video data associated with the first color;
generating second down-sampled video data based on the received video data, the second down-sampled video data associated with the third color, and
driving the first panel, the second panel, and the third panel, wherein:
the first light emitted by the first panel is based on the first down-sampled video data, and
the third light emitted by the third panel is based on the second down-sampled video data.

13. The method of claim 12, wherein the second resolution of the second panel is higher than the first resolution of the first panel and is higher than the third resolution of the third panel.

14. The method of claim 12, wherein the first light comprises a red light, the second light comprises a green light, and the third light comprises a blue light.

15. The method of claim 12, wherein:
the first light comprises a first monochrome light,
the second light comprises a second monochrome light, and
the third light comprises a third monochrome light.

16. The method of claim 12, wherein the light emitters of the second array are smaller in size than the light emitters of the first array and are smaller in size than the light emitters of the third array.

17. The method of claim 12, wherein:
a light emitter of the first array has a first single-emitter footprint corresponding to a first set of dimensions;
a light emitter of the second array has a second single-emitter footprint corresponding to a second set of dimensions; and
a light emitter of the third array has a third single-emitter footprint corresponding to a third set of dimensions, and
wherein the second single-emitter footprint is smaller than the first single-emitter footprint and is smaller than the third single-emitter footprint.

18. The method of claim 17, wherein a 2×2 array of four light emitters of the second array corresponds to a fourth set of dimensions, and wherein each of the first set of dimensions, the third set of dimensions, and the fourth set of dimensions are substantially equal.

19. The method of claim 18, wherein:
a 2×2 array of four light emitters of the first array corresponds to a fifth set of dimensions,
a 4×4 array of sixteen light emitters of the second array corresponds to a sixth set of dimensions, and
each of the third set of dimensions, the fifth set of dimensions, and the sixth set of dimensions are substantially equal.

20. The method of claim 12, wherein the combiner comprises an X-cube combiner.

* * * * *